United States Patent [19]
Fontana, Jr. et al.

[11] Patent Number: 6,005,753
[45] Date of Patent: Dec. 21, 1999

[54] MAGNETIC TUNNEL JUNCTION MAGNETORESISTIVE READ HEAD WITH LONGITUDINAL AND TRANSVERSE BIAS

[75] Inventors: Robert Edward Fontana, Jr.; Stuart Stephen Papworth Parkin, both of San Jose; Ching Hwa Tsang, Sunnyvale, all of Calif.

[73] Assignee: International Business Machines Corporation, Armonk, N.Y.

[21] Appl. No.: 09/087,322

[22] Filed: May 29, 1998

[51] Int. Cl.$^6$ ........................................ G11B 5/39
[52] U.S. Cl. ........................................ 360/113
[58] Field of Search ........................ 360/113; 365/171, 365/173

[56] References Cited

U.S. PATENT DOCUMENTS

| | | | |
|---|---|---|---|
| 3,623,038 | 11/1971 | Franklin et al. | 340/174 TF |
| 4,277,808 | 7/1981 | Nagaki | 360/113 |
| 4,899,240 | 2/1990 | McClure | 360/113 |
| 4,972,284 | 11/1990 | Smith et al. | 360/113 |
| 4,987,508 | 1/1991 | Smith | 360/113 |
| 5,018,037 | 5/1991 | Krounbi et al. | 360/113 |
| 5,021,909 | 6/1991 | Shiiba | 360/113 |
| 5,390,061 | 2/1995 | Nakatani et al. | 360/113 |
| 5,416,353 | 5/1995 | Kamiguchi et al. | 257/421 |
| 5,428,491 | 6/1995 | Smith | 360/113 |
| 5,432,734 | 7/1995 | Kawano et al. | 365/158 |
| 5,465,185 | 11/1995 | Heim et al. | 360/113 |
| 5,528,440 | 6/1996 | Fontana et al. | 360/113 |
| 5,650,958 | 7/1997 | Gallagher et al. | 365/173 |
| 5,729,410 | 3/1998 | Fontana et al. | 360/113 |
| 5,764,567 | 6/1998 | Parkin | 365/173 |
| 5,801,984 | 9/1998 | Parkin | 365/158 |

FOREIGN PATENT DOCUMENTS

WO 95/10123   4/1995   WIPO.

OTHER PUBLICATIONS

M. Julliere, "Tunneling Between Ferromagnetic Films", Physics Letters, vol. 54A, No. 3, Sep. 8, 1975, pp. 225–226.

K. Matsuyama et al., "Fabrication of Microstructured Magnetic Tunneling Valve Junction", IEEE Transactions on Magnetics, vol. 31, NO. 6, Nov. 1995, pp. 3176–3178.

J. S. Moodera et al., "Ferromagnetic–insulator–ferromagnetic Tunneling: Spin–dependent Tunneling and Large Magnetoresistance in Trilayer Junctions", Symposium on Spin Tunneling and Injection Phenomena, Journal of Applied Physics, vol. 79, No. 8, Apr. 15, 1996, pp. 4724–4729.

*Primary Examiner*—William J. Klimowicz
*Attorney, Agent, or Firm*—Thomas R. Berthold

[57] ABSTRACT

A magnetic tunnel junction magnetoresistive read head has one fixed ferromagnetic layer and one generally rectangularly shaped sensing ferromagnetic layer on opposite sides of the tunnel barrier layer, and a biasing ferromagnetic layer located around the side edges and back edges of the sensing ferromagnetic layer. An electrically insulating layer separates the biasing layer from the edges of the sensing layer. The biasing layer is a continuous boundary biasing layer that has side regions and a back region to surround the three edges of the sensing layer. When the biasing layer is a single layer with contiguous side and back regions its magnetic moment can be selected to make an angle with the long edges of the sensing layer. In this manner the biasing layer provides both a transverse bias field to compensate for transverse ferromagnetic coupling and magnetostatic coupling fields acting on the sensing layer to thus provide for a linear response of the head and a longitudinal bias field to stabilize the head. The biasing layer may also be formed with discrete side regions and a back region. The discrete side regions may have a magnetic moment oriented in a different direction from the moment of the back region in order to provide the correct combination of transverse and longitudinal bias fields.

20 Claims, 13 Drawing Sheets

MAGNETIC TUNNEL JUNCTION MAGNETORESISTIVE READ HEAD WITH LONGITUDINAL AND TRANSVERSE BIAS

RELATED APPLICATIONS

This application is related to application Ser. No. 09/087,553 titled "MAGNETIC TUNNEL JUNCTION MEMORY CELL WITH IN-STACK BIASING OF THE FREE FERROMAGNETIC LAYER AND MEMORY ARRAY USING THE CELL" and application Ser. No. 09/087,334 titled "MAGNETIC TUNNEL JUNCTION MAGNETORESISTIVE SENSOR WITH IN-STACK BIASING", both filed concurrently with this application.

TECHNICAL FIELD

This invention relates in general to magnetic tunnel junction (MTJ) devices, and more particularly to an MTJ device with both longitudinal and transverse biasing for use as a magnetoresistive (MR) head for reading magnetically-recorded data.

BACKGROUND OF THE INVENTION

A magnetic tunnel junction (MTJ) device is comprised of two ferromagnetic layers separated by a thin insulating tunnel barrier layer and is based on the phenomenon of spin-polarized electron tunneling. One of the ferromagnetic layers has a higher saturation field in one direction of an applied magnetic field, typically due to its higher coercivity than the other ferromagnetic layer. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers.

MTJ devices have been proposed primarily as memory cells for solid state memory. The state of the MTJ memory cell is determined by measuring the resistance of the MTJ when a sense current is passed perpendicularly through the MTJ from one ferromagnetic layer to the other. The probability of tunneling of charge carriers across the insulating tunnel barrier layer depends on the relative alignment of the magnetic moments (magnetization directions) of the two ferromagnetic layers. The tunneling current is spin polarized, which means that the electrical current passing from one of the ferromagnetic layers, for example, a layer whose magnetic moment is fixed or prevented from rotation, is predominantly composed of electrons of one spin type (spin up or spin down, depending on the orientation of the magnetic moment of the ferromagnetic layer). The degree of spin polarization of the tunneling current is determined by the electronic band structure of the magnetic material comprising the ferromagnetic layer at the interface of the ferromagnetic layer with the tunnel barrier layer. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged neither parallel nor antiparallel, the tunneling probability takes an intermediate value. Thus, the electrical resistance of the MTJ memory cell depends on both the spin polarization of the electrical current and the electronic states in both of the ferromagnetic layers. As a result, the two possible magnetization directions of the ferromagnetic layer whose magnetization direction is not fixed uniquely define two possible bit states (0 or 1) of the memory cell.

A magnetoresistive (MR) sensor detects magnetic field signals through the resistance changes of a sensing element, fabricated of a magnetic material, as a function of the strength and direction of magnetic flux being sensed by the sensing element. Conventional MR sensors, such as those used as a MR read heads for reading data in magnetic recording disk drives, operate on the basis of the anisotropic magnetoresistive (AMR) effect of the bulk magnetic material, which is typically permalloy ($Ni_{81}Fe_{19}$). A component of the read element resistance varies as the square of the cosine of the angle between the magnetization direction in the read element and the direction of sense current through the read element. Recorded data can be read from a magnetic medium, such as the disk in a disk drive, because the external magnetic field from the recorded magnetic medium (the signal field) causes a change in the direction of magnetization in the read element, which in turn causes a change in resistance of the read element and a corresponding change in the sensed current or voltage. In conventional MR read heads, in contrast to MTJ devices, the sense current is in a direction parallel to the ferromagnetic layer of the read element.

The use of an MTJ device as a magnetoresistive (MR) read head for magnetic recording has also been proposed, as described in U.S. Pat. No. 5,390,061. One of the problems with such an MR head, however, lies in developing a suitable structure in which the output signal of the device is linearly related to the magnetic field strength from the recorded magnetic medium and which, in addition, is a magnetically stable device. To obtain a linear response in a MTJ device is particularly difficult, because, unlike AMR sensors, the current passes perpendicularly through the ferromagnetic layers and the tunnel barrier and thus provides no transverse bias field to the ferromagnetic sensing layer. Thus some additional means must be provided in an MTJ sensor for proper transverse biasing of the ferromagnetic sensing layer so that it will give a linear response to the sense field. In addition a means must be provided to ensure that the ferromagnetic sensing layer is maintained in a single magnetic domain state. If such means is not provided a multi-domain state may be formed within the ferromagnetic sensing layer which may give rise to noise and thereby a decreased signal-to-noise characteristic of the device and, in addition, may lead to irreproducible responses of the device to sense fields. The device may be stabilized in a largely single magnetic domain state by the presence of a longitudinal bias field. IBM's U.S. Pat. No. 5,729,410 describes a MTJ MR read head with ferromagnetic material for longitudinally stabilizing or biasing the sensing ferromagnetic layer, wherein the biasing material is located outside the MTJ stack and separated from the stack by electrically insulating material.

What is needed is an MTJ MR read head in which the performance of the device can be optimized to give a linear output signal by controlling the transverse bias field and in which a longitudinal bias field provides a stable output signal.

SUMMARY OF THE INVENTION

The invention is an MTJ MR read head with one fixed ferromagnetic layer and one generally rectangularly shaped sensing ferromagnetic layer on opposite sides of the tunnel barrier layer, and with a biasing ferromagnetic layer located around the side edges and back edges of the sensing ferromagnetic layer. An electrically insulating layer separates the biasing layer from the edges of the sensing layer. The biasing layer is a continuous boundary biasing layer that has side regions and a back region to surround the three edges of the sensing layer. When the biasing layer is a single layer with contiguous side and back regions its magnetic moment can be selected to make an angle with the long edges of the sensing layer. In this manner the biasing layer provides both a transverse bias field to compensate for transverse ferromagnetic coupling and magnetostatic coupling fields acting on the sensing layer to thus provide for a linear response of the MTJ MR read head and a longitudinal bias field to stabilize the head. The biasing layer may also be formed with discrete side regions and a back region. The discrete side regions may have a magnetic moment oriented in a different direction from the moment of the back region in order to provide the correct combination of transverse and longitudinal bias fields.

For a fuller understanding of the nature and advantages of the present invention, reference should be made to the following detailed description taken together with the accompanying figures.

DESCRIPTION OF THE INVENTION

Prior Art

Figure 1:
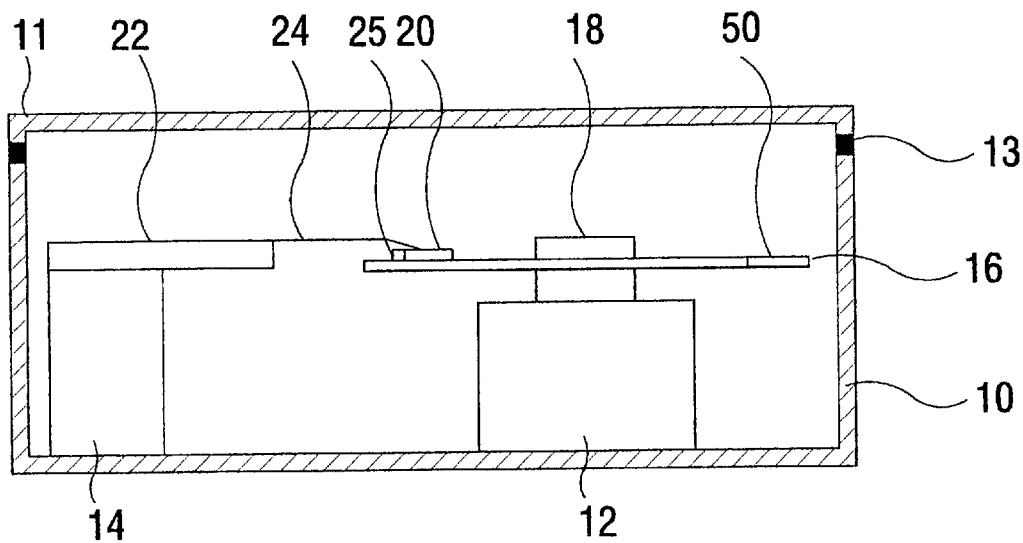
FIG. 1 is a simplified block diagram of a conventional magnetic recording disk drive for use with the MTJ MR read head according to the present invention.

Referring first to FIG. 1, there is illustrated in sectional view a schematic of a prior art disk drive of the type using a MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 is a read/write head comprising an inductive write head portion and a MR read head portion, as will be described with respect to FIG. 3. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head 25 may access different data tracks on disk 16.

Figure 2:
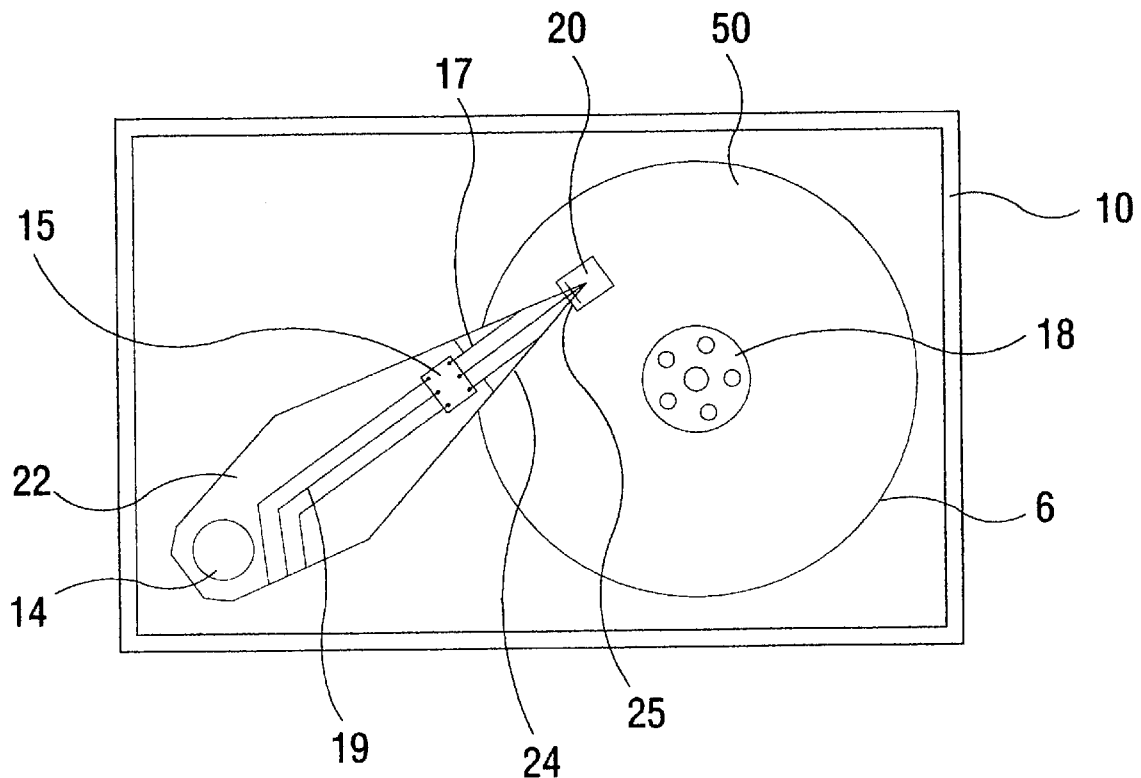
FIG. 2 is a top view of the disk drive of FIG. 1 with the cover removed.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals to the disk drive electronics (not shown) via cable 19.

Figure 3:
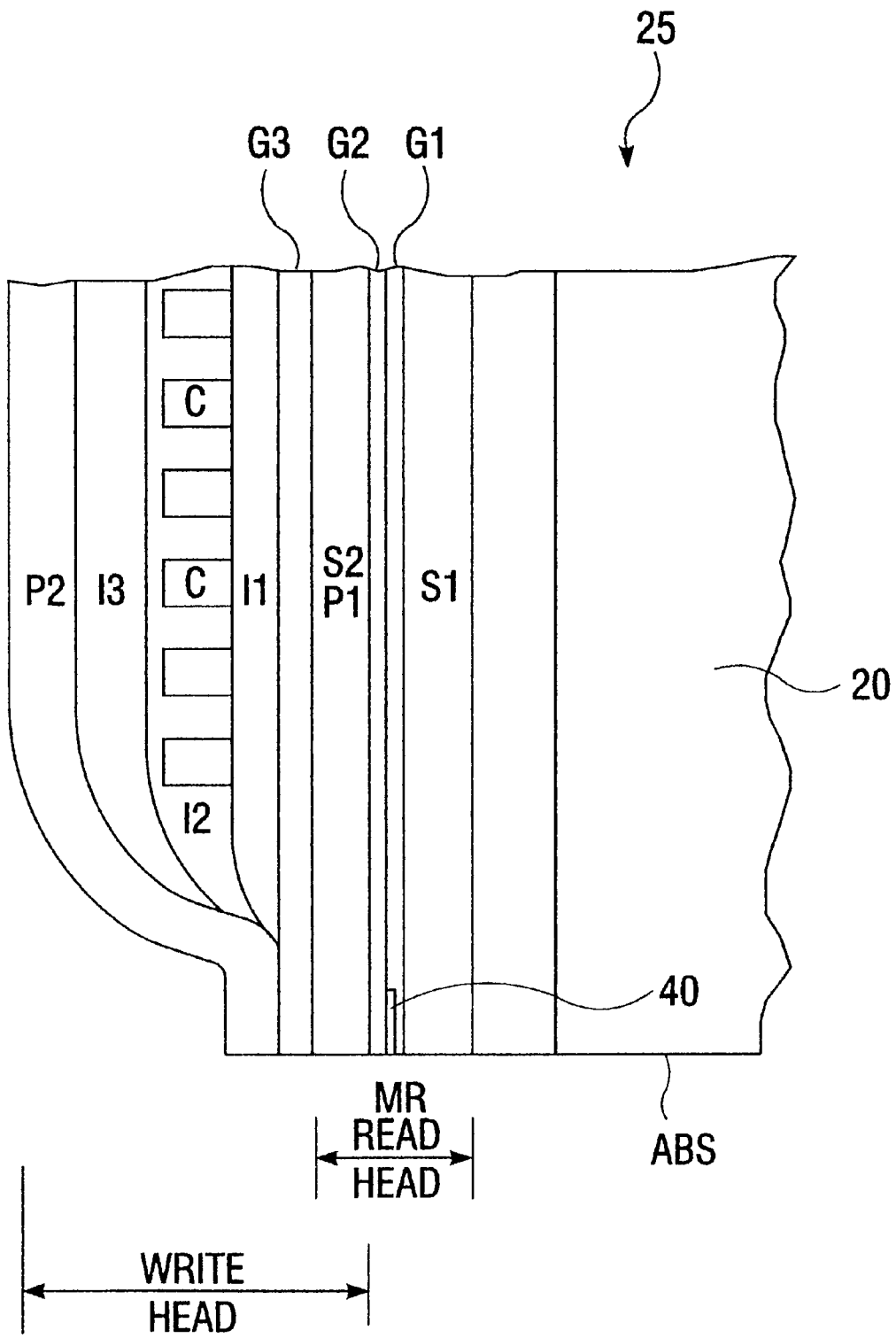
FIG. 3 is a vertical cross-section of a conventional integrated inductive write head/MR read head with the MR read head located between shields and adjacent to the inductive write head.

FIG. 3 is a cross-sectional schematic view of the integrated read/write head 25 which includes a MR read head portion and an inductive write head portion. The head 25 is lapped to form an air-bearing surface (ABS), the ABS being spaced from the surface of the rotating disk 16 (FIG. 1) by the air bearing as discussed above. The read head includes a MR sensor 40 sandwiched between first and second gap layers G1 and G2 which are, in turn, sandwiched between first and second magnetic shield layers S1 and S2. In a conventional disk drive, the MR sensor 40 is an AMR sensor. The write head includes a coil layer C and insulation layer I2 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes circular tracks on the rotating disk 16 during a write operation. During a read operation, magnetized regions on the rotating disk 16 inject flux into the MR sensor 40 of the read head, causing resistance changes in the MR sensor 40. These resistance changes are detected by detecting voltage changes across the MR sensor 40. The voltage changes are processed by the chip 15 (FIG. 2) and drive electronics and converted into user data. The combined head 25 shown in FIG. 3 is a "merged" head in which the second shield layer S2 of the read head is employed as a first pole piece P1 for the write head. In a piggyback head (not shown), the second shield layer S2 and the first pole piece P1 are separate layers.

The above description of a typical magnetic recording disk drive with an AMR read head, and the accompanying FIGS. 1–3, are for representation purposes only. Disk drives may contain a large number of disks and actuators, and each actuator may support a number of sliders. In addition, instead of an air-bearing slider, the head carrier may be one which maintains the head in contact or near contact with the disk, such as in liquid bearing and other contact and near-contact recording disk drives.

Figure 4:
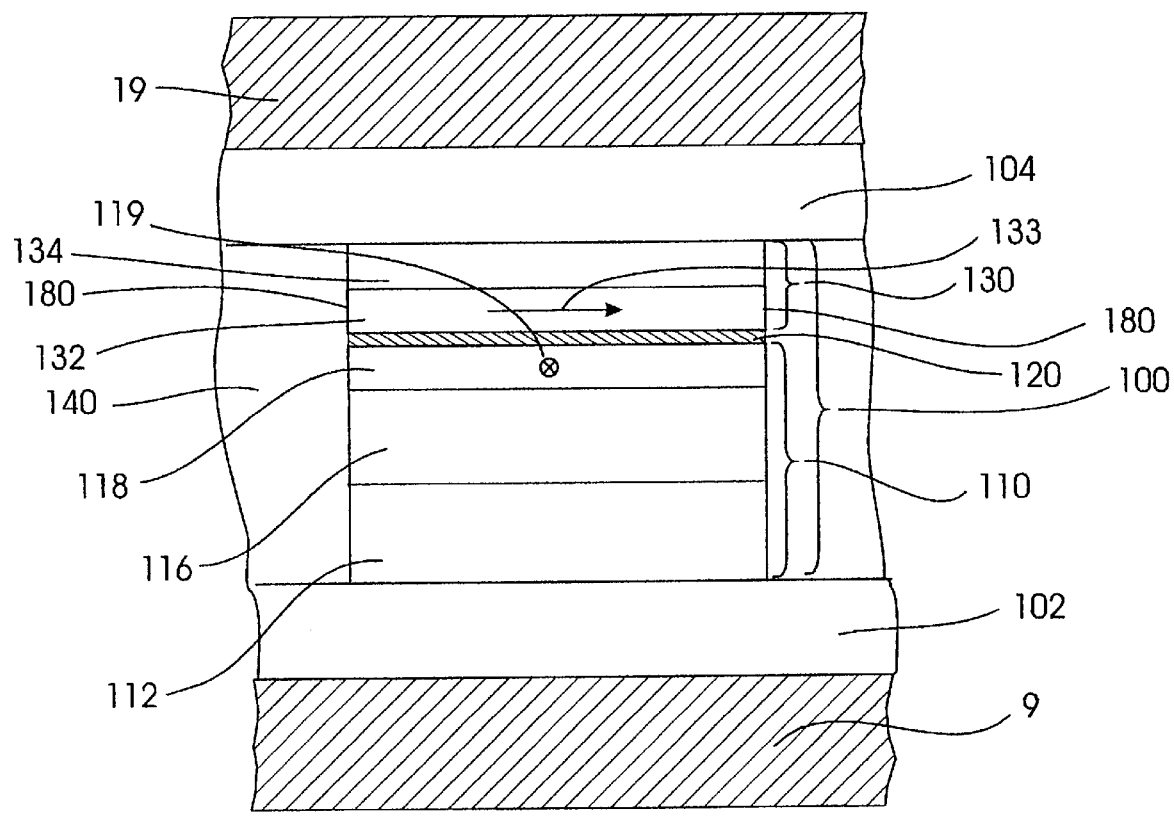
FIG. 4 is a cross-section of the magnetic tunnel junction layers and conducting leads for use in the MTJ MR read head of the present invention.

FIG. 4 illustrates a prior art MTJ MR read head with an MTJ sensor for use in place of the MR sensor 40 in the read/write head 25 of FIG. 3. A bottom electrical lead 102 is formed on a suitable substrate 9. The substrate may the gap layer G1 or alternatively the lead 102 may be formed directly on the magnetic shield S1. The MTJ 100 is then formed as a stack of layers between the bottom electrical lead 102 and a top electrical lead 104. The top electrical lead may be electrically isolated from the shield S2 or may be directly connected to the shield S2 which may form itself part of the electrical circuit to the MTJ device.

The MTJ 100 includes a first or bottom electrode multi-layer stack 110, an insulating tunnel barrier layer 120, and a second or top electrode stack 130. Each of the electrodes includes a ferromagnetic layer in direct contact with tunnel barrier layer 120, i.e., ferromagnetic layers 118 and 132.

The electrode layer stack 110 formed on electrical lead 102 includes a seed or "template" layer 112 on the lead 102, a layer of antiferromagnetic material 116 on the template layer 112, and a "fixed" ferromagnetic layer 118 formed on and exchange coupled with the underlying antiferromagnetic layer 116. The ferromagnetic layer 118 is called the fixed layer because its magnetic moment or magnetization direction is prevented from rotation in the presence of applied magnetic fields in the desired range of interest. The top electrode stack 130 includes a "free" or "sensing" ferromagnetic layer 132 and a protective or capping layer 134 formed on the sensing layer 132. The sensing ferromagnetic layer 132 is not exchange coupled to an antiferromagnetic layer, and its magnetization direction is thus free to rotate in the presence of applied magnetic fields in the range of interest. The sensing ferromagnetic layer 132 is fabricated so as to have its magnetic moment or magnetization direction (shown by arrow 133) oriented generally parallel to the ABS (the ABS is a plane parallel to the paper in FIG. 4; see also FIG. 3) and generally perpendicular to the magnetization direction of the fixed ferromagnetic layer 118 in the absence of an applied magnetic field. The fixed ferromagnetic layer 118 in electrode stack 110 just beneath the tunnel barrier layer 120 has its magnetization direction fixed by interfacial exchange coupling with the immediately underlying antiferromagnetic layer 116, which also forms part of bottom electrode stack 110. The magnetization direction of the fixed ferromagnetic layer 118 is oriented generally perpendicular to the ABS, i.e., out of or into the paper in FIG. 4 (as shown by arrow tail 119).

Figure 5A:
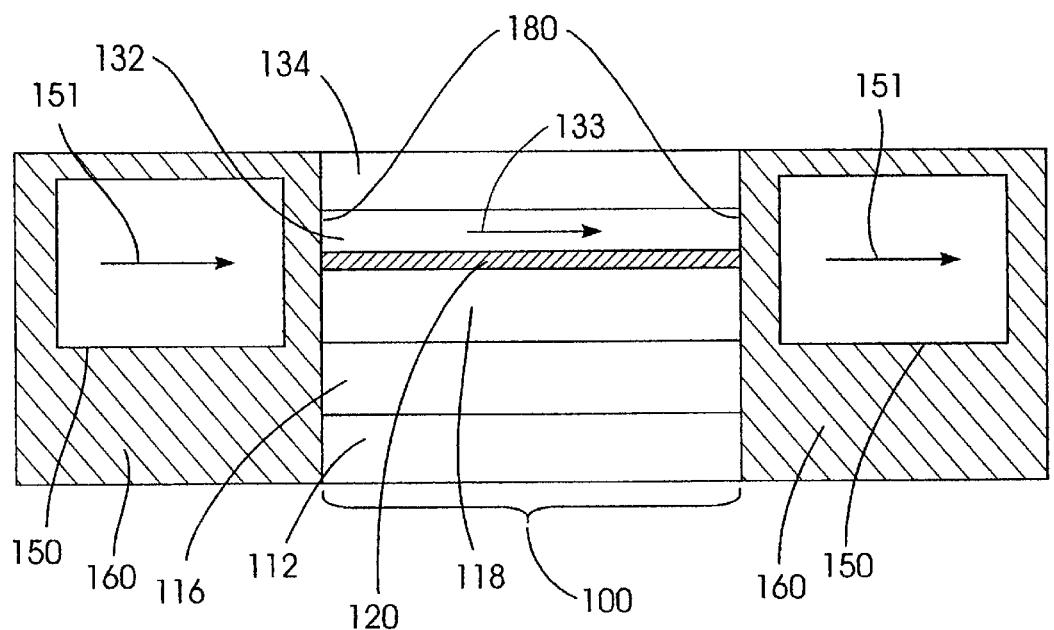
FIGS. 5A and 5B are top and cross-sectional views of a prior art MTJ read head with electrically isolated longitudinal bias regions to the left and right side of the MTJ device.
Figure 5B:
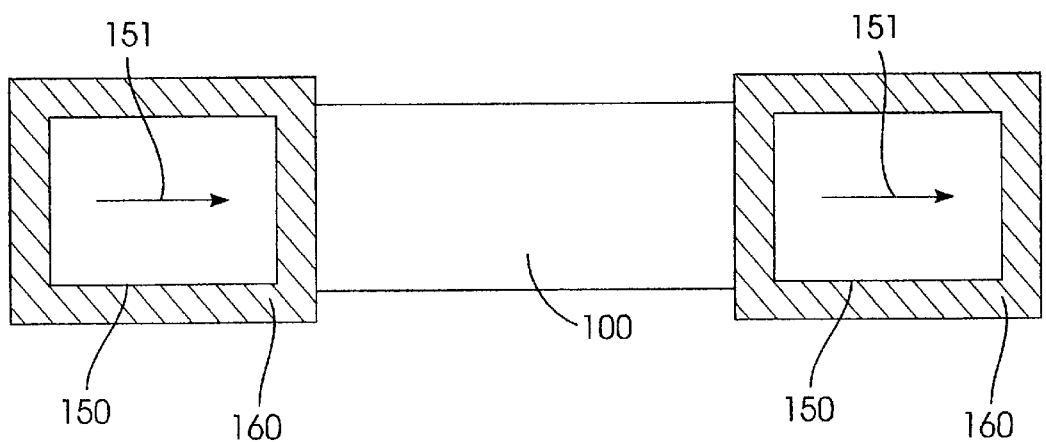

FIG. 5A and FIG. 5B show respectively, a sectional and a top view of the MTJ MR read head of FIG. 4 with additionally a biasing ferrromagnetic layer 150 for longitudinally biasing the magnetization of the sensing ferromagnetic layer 132, and an insulating layer 160 separating and isolating the biasing layer 150 from the sensing ferromagnetic layer 132 and the other layers of the MTJ 100. The device of FIGS. 5A–5B is described in more detail in IBM's U.S. Pat. No. 5,729,410. The biasing ferromagnetic layer 150 is comprised of a hard magnetic material, such as a CoPtCr alloy, that has its magnetic moment (shown by arrow 151) aligned in the same direction as the magnetic moment 133 of the sensing ferromagnetic layer 132 in the absence of an applied magnetic field. The insulating layer 160, which is preferably alumina ($Al_2O_3$) or silica ($SiO_2$), has a thickness sufficient to electrically isolate the biasing ferromagnetic layer 150 from the MTJ 100 and the electrical leads 102, 104, but is still thin enough to permit magnetostatic coupling with the sensing ferromagnetic layer 132. The product M*t of the biasing ferromagnetic layer 150 (where M is the magnetic moment per unit area of the material in the ferromagnetic layer and t is the thickness of the ferromagnetic layer) must be greater than or equal to the M*t of the sensing ferromagnetic layer 132 to assure stable longitudinal biasing. Since the magnetic moment of $Ni_{(100-x)}$—$Fe_{(x)}$ (x being approximately 19) that is typically used in the sensing ferromagnetic layer 132 is about twice that of the magnetic moment of a typical hard magnetic material suitable for the biasing ferromagnetic layer 150, such as $Co_{75}Pt_{13}Cr_{12}$, the thickness of the biasing ferromagnetic layer 150 is at least approximately twice that of the sensing ferromagnetic layer 132.

Figure 6:
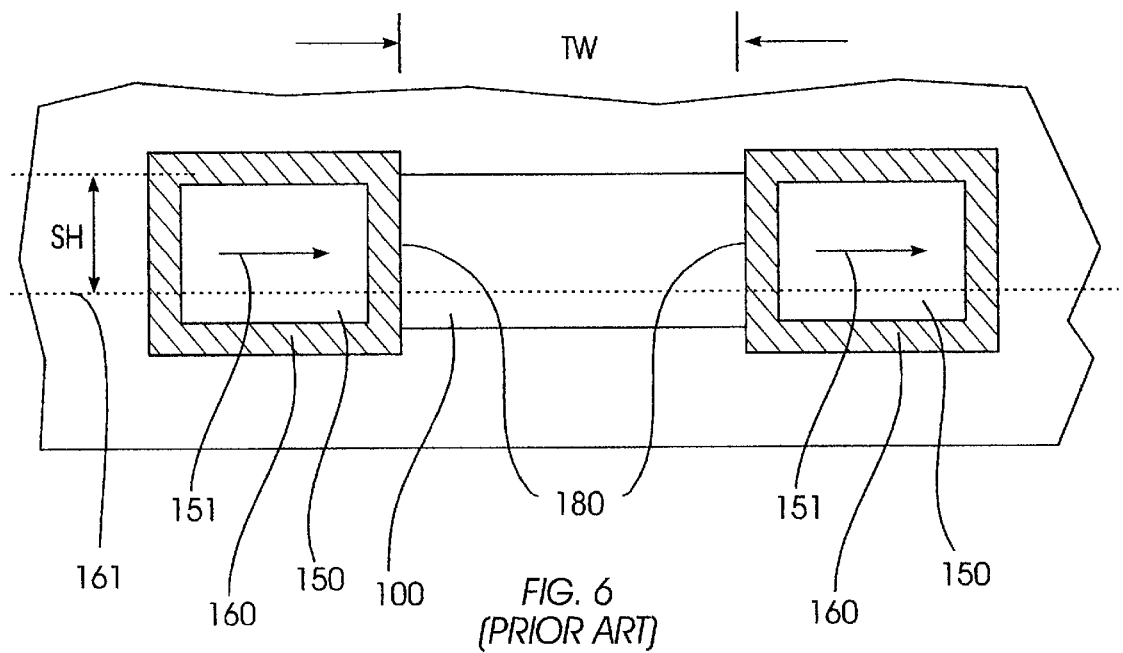
FIG. 6 is a top view of the prior art MTJ read head of FIG. 5 illustrating the disposition of the MTJ read head with regard to the air bearing surface.

FIG. 6 is a similar top view of the MTJ MR head shown in FIG. 5B but showing the disposition of the MTJ head with respect to the ABS. The dashed line 161 represents the ABS and the line to which the layers are lapped back after the MTJ MR head is fabricated. The MTJ 100 is depicted as a stripe having a width TW, appropriate to the track width of the recorded data on the disk, and a final stripe height SH after lapping. The width of the recorded data track is typically wider than TW. Note that for purposes of clarity we shall refer to the edges of the MTJ sensor where the longitudinal bias regions 150 are disposed as the left and right edges 180.

A sense current I is directed from the first electrical lead 102 perpendicularly through the antiferromagnetic layer 116, the fixed ferromagnetic layer 118, the tunnel barrier layer 120, and the sensing ferromagnetic layer 132 and then out through the second electrical lead 104. As described previously, the amount of tunneling current through the tunnel barrier layer 120 is a function of the relative orientations of the magnetizations of the fixed and sensing ferromagnetic layers 118, 132 that are adjacent to and in contact with the tunnel barrier layer 120. The magnetic field from the recorded data causes the magnetization direction of the sensing ferromagnetic layer 132 to rotate away from the direction 133, i.e., either into or out of the paper of FIG. 4. This changes the relative orientation of the magnetic moments of the ferromagnetic layers 118, 132 and thus the amount of tunneling current, which is reflected as a change in electrical resistance of the MTJ 100. This change in resistance is detected by the disk drive electronics and processed into data read back from the disk. The sense current is prevented from reaching the biasing ferromagnetic layer 150 by the electrical insulating layer 160, which also insulates the biasing ferromagnetic layer 150 from the electrical leads 102, 104.

The presence of the longitudinal bias regions 150 in FIGS. 5A–5B and 6 allow for stabilization of the MTJ ferromagnetic sensing layer into a largely single magnetic domain state. In the absence of the regions 150 it is very likely that the magnetic poles which would then be present at the edges 180 of the sensing layer 132 would result in the formation of closure domains at these edges. The multi-domain state of the sensing layer would then give rise to noise and irreproducible signals for otherwise the same sense field.

Preferred Embodiments

While the longitudinal bias regions eliminate the closure domains for proper operation of the MTJ read head there is, in addition, a requirement that the response of the head be linear in the applied sense field. This is achieved by properly transversely biasing the magnetic moment of the sensing layer 132. In the quiescent state in the absence of any sense field the optimum configuration of the MTJ read head is one in which the magnetic moment of the sensing layer 132 is oriented approximately parallel to the ABS 161 and approximately perpendicular to the magnetic moment of the pinned or fixed ferromagnetic layer 118. The moment of the fixed ferromagnetic layer 118 is oriented largely perpendicular to the ABS. Under these circumstances the magnetic moment of the sensing layer is arranged such that the MTJ device has maximum sensitivity to the sense field since the tunneling conductance of the MTJ device varies cosinusoidally as the angle between the directions of the magnetic moments of the sensing layer 132 and the fixed layer 118. Moreover, the maximum angular excursion of the magnetic moment of the sensing layer, resulting from the presence of the sense field before saturation of the tunneling conductance of the device, is the same for either direction of the sense field parallel and antiparallel to the normal to the ABS.

Figure 7:
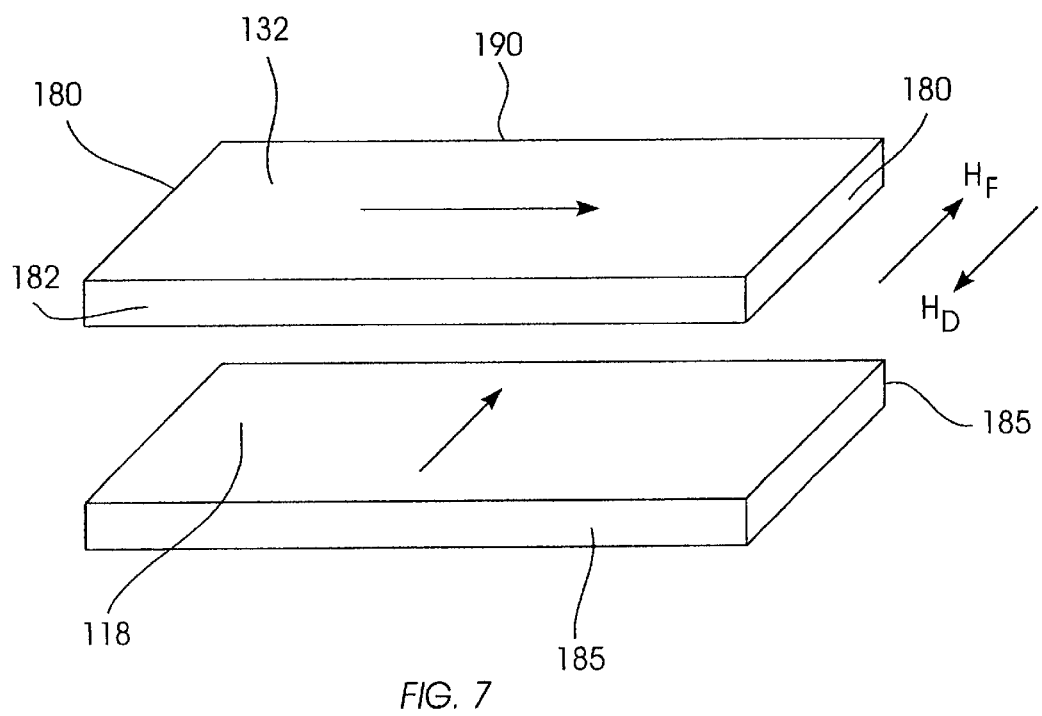
FIG. 7 illustrates the ferromagnetic coupling field and magnetostatic coupling field acting on an MTJ sensing layer from the pinned or fixed ferromagnetic layer.

As shown in FIG. 7, the sensing layer 132 has a front edge 182 that faces the ABS, a back edge 190 and side edges 180. The orientation of the magnetic moment of the sensing layer 132, in the absence of any sense field, is determined by the net effective magnetic field acting on the sensing ferromagnetic layer. As illustrated schematically in FIG. 7 this is largely the result of a balance between any ferromagnetic coupling field $H_F$ between the sensing layer 132 and the fixed ferromagnetic layer 118 and the magnetostatic coupling field $H_D$ on the sensing layer arising largely from the magnetic poles at the edges 185 of the fixed ferromagnetic layer. In addition, the sensing layer 132 may exhibit some magnetic anisotropy which may favor the orientation of the magnetic moment of the sensing layer along a particular direction in the plane of the sensing layer. The magnetic anisotropy may arise from the intrinsic magnetocrystalline anisotropy of the ferromagnetic material comprising the sensing layer or may be induced via the deposition of the sensing ferromagnetic layer in a magnetic field or via the sensing layer's magnetostriction from stress in the sensing layer, for example, introduced during the processing of the MTJ device. In addition, there may be some magnetic shape anisotropy derived from the self magnetostatic field of the sensing layer.

The magnetostatic coupling field $H_D$ may be varied by varying the thickness and magnetic moment of the fixed ferromagnetic layer or by forming the fixed ferromagnetic layer from an antiferromagnetically coupled sandwich of two ferromagnetic layers separated by a thin antiferromagnetically coupling layer, as described in IBM's pending application Ser. No. 08/895,118 filed Jul. 16, 1997. The ferromagnetic coupling field $H_F$ may be varied by introducing a thin non-ferromagnetic layer between the tunnel barrier layer 120 and the ferromagnetic sensing layer 132, as described in IBM's pending application Ser. No. 08/758,614 filed Nov. 27, 1996. However the use of additional non-ferromagnetic layers reduces the magnitude of the magneto-tunneling response of the MTJ device. Moreover these methods require a more complicated MTJ device 100 which may be more difficult to manufacture and may require additional deposition sources for the additional layers which may not be available. Furthermore the magnetic moment (and consequently the thickness) of the sensing layer may be fixed by the density of recorded magnetic bits for optimum performance of the magnetic recording read head.

Figure 8:
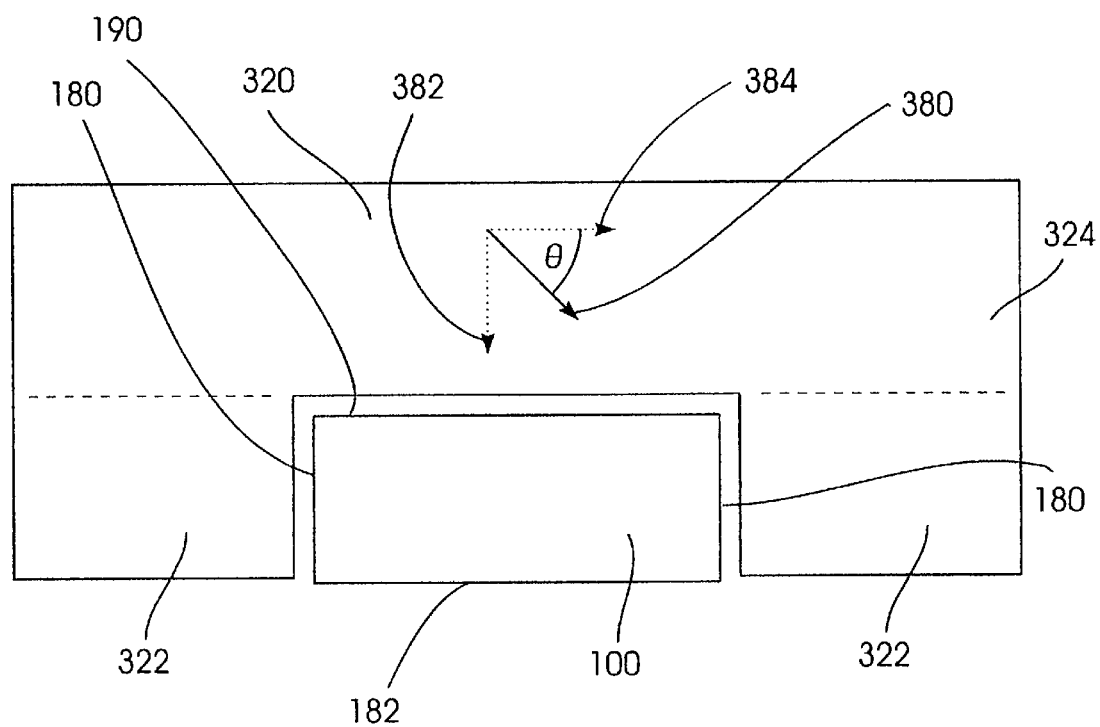
FIG. 8 is a top view of the MTJ MR read head of the present invention with an ferromagnetic bias region around three sides of the tunnel junction which provides both longitudinal and transverse bias fields.

In conventional MR devices there is an additional magnetic field operating on the ferromagnetic sensing layer which arises from the current which is passed parallel to the layers of the magnetic device. By contrast, in MTJ devices the current is passed perpendicular to the ferromagnetic layers and thereby produces a negligible transverse magnetic field on the sensing layer. Thus in the MTJ device a mechanism to provide an additional transverse magnetic bias field is needed to optimally bias the MTJ device. As illustrated in FIG. 8 such a transverse bias field is provided by a ferromagnetic biasing layer 320 that has longitudinal bias regions 322 near the left and right edges 180 of the sensing layer 132 (as shown in FIG. 7) and a transverse bias region 324 along the back edge 190 away from the ABS surface. The biasing layer 320 will be referred to as the continuous boundary biasing (CBB) layer. The front edge 182 of the sensing layer in MTJ sensor 100, i.e., the edge located at the ABS, remains uncovered so that magnetic flux from recorded bits in the magnetic medium may be detected by the sensing layer. The front edge of the MTJ sensor may be situated directly at the ABS as in FIG. 8 or may be recessed from the ABS and the flux may be brought to the recessed front edge of the sensor by means of a flux guide. The use of the additional bias region 324 at the back edge 190 allows for a moderate amount of transverse bias field (along the direction indicated by the arrow 382 in FIG. 8). In addition, a longitudinal bias field (along the direction of the arrow 384 in FIG. 8) may be applied to the MTJ 100 by canting the direction of the magnetic moment of the CBB layer 320 away from the ABS in the plane of the film, as indicated by the arrow 380 in FIG. 8. By properly adjusting the canting angle θ, the magnitude of the transverse bias field from the CBB layer 320 can be arbitrarily varied, within a certain range, so as to obtain a more complete compensation of the transverse fields $H_D$ and $H_F$ on the MTJ ferromagnetic sensing layer. At the same time the CBB layer 320 provides a sufficient longitudinal bias field for stabilization of the MTJ sensor. The magnetic moment can have a direction 380 between ±90 degrees, where 0 degrees corresponds to a purely longitudinal direction parallel to the long edges of the rectangularly shaped sensing layer 132 and in the same direction as the moment of the sensing layer in the absence of an applied field. Proper selection of the angle θ assures both transverse biasing to compensate for transverse fields for a linear response and longitudinal biasing for stabilization.

Figure 9:
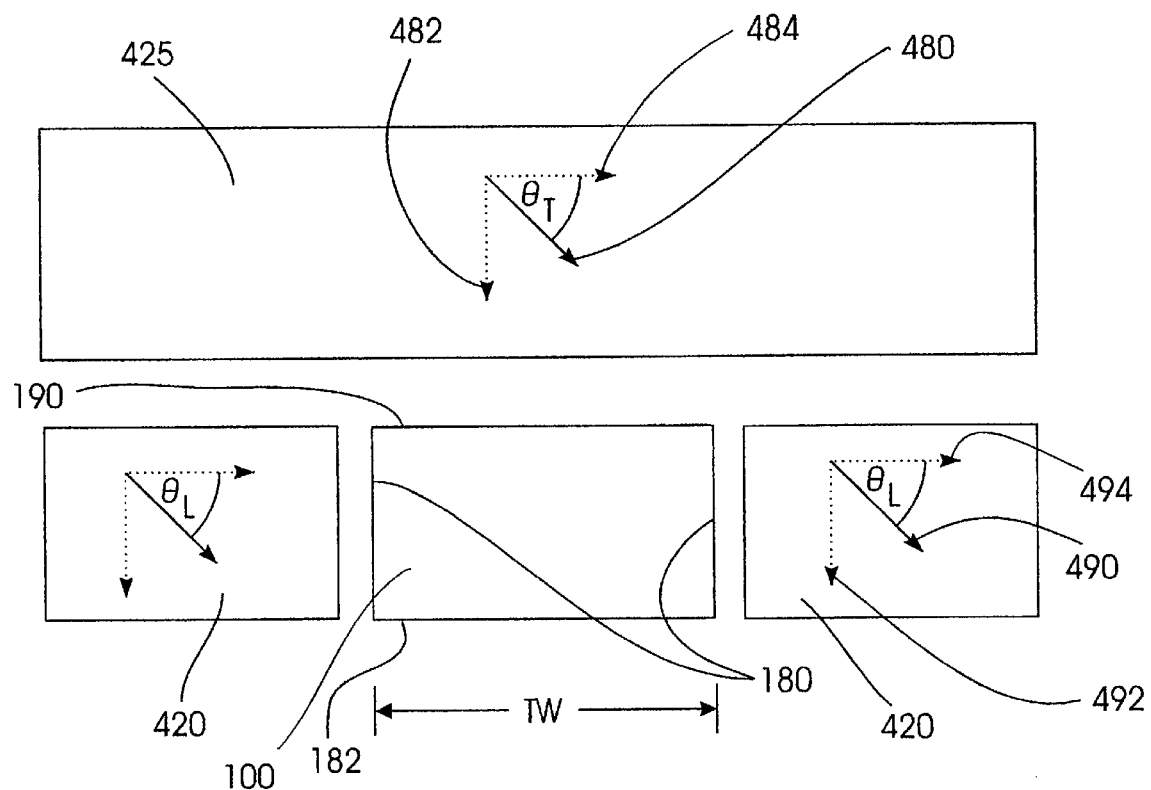
FIG. 9 is a top view of the MTJ MR read head of the present invention with separate ferromagnetic bias regions around three sides of the tunnel junction in which one bias region at the back edge of the tunnel junction provides a transverse bias field while separate regions on the sides of the tunnel junction provide a longitudinal bias field.

As shown in FIG. 9, in an alternative embodiment a CBB layer 425 may be formed as three distinct portions, the two longitudinal bias portions 420 at the side edges of the sensing ferromagnetic layer of the MTJ 100 and the rear or back transverse bias portion 425. The longitudinal bias field is provided by the bias portions 420 at the left and right sides edges 180 of the MTJ 100 but in this embodiment the biasing portion at the rear edge 190 is fabricated as a separate region 425. Thus the magnetic moments of the two biasing regions 420 and 425 can be independently designed to provide the appropriate strengths and directions of transverse and longitudinal bias fields. In the simplest embodiment the direction of the magnetic moments of the transverse and longitudinal bias regions 420 and 425 are oriented along a common canting angle along the direction indicated by the arrow 480 in FIG. 9. Thus the longitudinal and transverse bias fields are along the directions indicated by the arrows 484 and 482 in FIG. 9. In another embodiment, where the transverse bias portion 425 and longitudinal bias portions 420 are formed from different hard or high coercivity ferromagnetic materials, the canting angle $\theta_T$ of the transverse bias region 425 and the canting angle $\theta_L$ of the longitudinal bias region 420 may be set at different canting angles.

A representative set of materials for MTJ 100 (FIG. 4) will now be described. All of the layers of the MTJ 100 are grown in the presence of a magnetic field applied parallel to the surface of the substrate. The magnetic field serves to orient the easy axis of all of the ferromagnetic layers. A 5 nm Ta seed layer (not shown) is first formed on a 10–50 nm Au layer that serves as the electrical lead 102. The seed layer is comprised of a material which encourages the (111) growth of the face-centered cubic (fcc) $Ni_{81}Fe_{19}$ template layer 112. The template ferromagnetic layer 112 encourages the growth of the antiferromagnetic layer 116. Suitable seed layer materials include fcc metals, such as Cu, as well as Ta or a combination of layers, such as 3–5 nm Ta/3–5 nm Cu. The MTJ base electrode stack 110 comprises a stack of 4 nm $Ni_{81}Fe_{19}$/10 nm $Fe_{50}Mn_{50}$/8 nm $Ni_{81}Fe_{19}$ (layers 112, 116, 118, respectively) grown on the Ta seed layer on the 10–20 nm Au layer 102. The Au lead layer 102 is formed on the alumina gap material G1 that serves as the substrate. Next, the tunnel barrier layer 120 is formed by depositing and then plasma oxidizing a 0.5–2 nm Al layer. This creates the $Al_2O_3$ insulating tunnel barrier layer 120. The top electrode stack 130 is a 5 nm Ni—Fe/10 nm Ta stack (layers 132,134, respectively). The Ta layer 134 serves as a protective capping layer. The top electrode stack 130 is contacted by a 20 nm Au layer that serves as the electrical lead 104.

Note that since the current passes perpendicular to the layers in MTJ 100, the resistance of the MTJ device will be largely dominated by that of the tunnel barrier layer 120. Thus, the resistance per unit area of the conducting leads 102, 104 can be much higher than in conventional MR read heads in which the current flows parallel to the layers. Thus, the leads 102, 104 can be made thinner and/or narrower than in conventional MR head structures, and/or can be made from intrinsically more resistive materials, such as alloys or combinations of elements.

It is important that the layers in the bottom electrode stack 110 be smooth, and that the $Al_2O_3$ tunnel barrier layer 120 be free of pinholes which would electrically short the junction. For example, growth by sputtering techniques known to produce good giant magnetoresistance effects in metallic multilayer stacks is sufficient.

An alternative sensing ferromagnetic layer 132 may be comprised of a thin Co or $Co_{(100-x)}Fe_{(x)}$ or $Ni_{(100-x)}Fe_x$ (x is approximately 60) layer at the interface between the sensing ferromagnetic layer 132 and the tunnel barrier layer 120, with the bulk of layer 132 being a low magnetostriction material, such as $Ni_{(100-x)}Fe_x$ (x is approximately 19). The net magnetostriction of this type of sensing layer with a thin Co or $Co_{(100-x)}Fe_{(x)}$ or $Ni_{(100-x)}Fe_x$ (x is approximately 60) interface layer is arranged to have a value close to zero by slight variations of the composition of the bulk of layer 132. An alternative fixed ferromagnetic layer 118 may be comprised largely of a bulk $Ni_{(100-x)}Fe_{(x)}$ layer with a thin layer of a Co or $Co_{(100-x)}Fe_{(x)}$ or $Ni_{(100-x)}Fe_x$ (x is approximately 60) layer at the interface with the tunnel barrier layer 120. The largest signal is obtained with Co or with the highest polarization $Ni_{(100-x)}Fe_x$ (x is approximately 60) or $Co_{(100-x)}Fe_{(x)}$ alloy (x is approximately 70). The interface layer is optimally about 1–2 nm thick. The net magnetostriction of the combined layer is arranged to be close to zero by small variations of the composition. If the bulk of layer 118 is Ni—Fe, then the composition is $Ni_{81}Fe_{19}$, the composition for which bulk Ni—Fe has zero magnetostriction.

The Fe—Mn antiferromagnetic layer 116 may be replaced with a Ni—Mn or Ir—Mn layer or other suitable antiferromagnetic layer which exchange biases the ferromagnetic material in the fixed layer 118 and which has a resistance which is substantially less than that of the $Al_2O_3$ barrier layer 120. For example antiferromagnetic oxide layers with sufficient conductivity may be used. In addition, while in the preferred embodiment the fixed ferromagnetic layer has its magnetic moment fixed by interfacial exchange coupling with an antiferromagnetic layer, the fixed ferromagnetic layer may be formed of a magnetically "hard" high coercivity material, thereby avoiding the need for an antiferromagnetic layer. The hard fixed ferromagnetic layer may thus be formed from a variety of ferromagnetic materials, such as alloys of Co and one or more other elements, including Co—Pt alloys, Co—Pt—Cr alloys, Co—Cr—Ta alloys, Co—Cr alloys, Co—Sm alloys, Co—Re alloys, Co—Ru alloys, and Co—Ni—X alloys (X =Pt, Pd, or Cr), as well as a variety of quaternary alloys, such as Co—Ni—Cr—Pt and Co—Pt—Cr—B.

While the MTJ device described and shown in FIG. 4 has the fixed ferromagnetic layer on the bottom of MTJ 100, the device can also be formed by depositing the sensing ferromagnetic layer first, followed by the tunnel barrier layer, the fixed ferromagnetic layer, and the antiferromagnetic layer. Such an MTJ device would then have the layers essentially inverted from the MTJ 100 shown in FIG. 4.

Process for Fabricating the MTJ MR Read Head of the Present Invention

The process for forming the MTJ MR read head with the CBB layer 320 of the present invention will first be described with reference to the process flow diagram of FIGS. 10A–10E. In this series of figures only the top view of the device is shown to illustrate the basic lithographic patterning steps necessary to create the MTJ MR head shown in FIG. 8.

For ease in illustrating the process, the individual layers making up MTJ 100 will not be shown in FIGS. 10A–10E, but these series of layers will be individually referred to as the MTJ. The substrate (not shown) onto which the layers are deposited is the either the G1 alumina gap layer or the shield S1. Film growths are carried out by magnetron sputtering with argon (Ar) gas with the substrate at ambient temperature. Care must be taken to ensure that the sputter growth produces very smooth films. An applied magnetic field of magnitude 20–100 Oe, with the field direction in the plane of the substrate may be used to induce magnetic anisotropy into the ferromagnetic layers as they are grown. As part of the formation of the MTJ 100, the aluminum layer which is to become the tunnel barrier layer 120 is deposited and then subsequently plasma oxidized at an oxygen pressure of 100 mTorr and a power density of 25 W/cm² for 30–240 seconds. This forms the insulating tunnel barrier layer 120 of alumina. The plasma oxidation of the aluminum layer is done without breaking vacuum in the process.

Although not essential to the operation of the MTJ device, it may be beneficial to induce in the fixed and sensing ferromagnetic layers appropriate magnetic anisotropies by depositing these layers in approximately orthogonal magnetic fields. Prior to the deposition of the sensing ferromagnetic layer 132 in the MTJ 100 and after formation of the alumina tunnel barrier layer 120, the substrate is rotated approximately 90 degrees in the plane of the substrate so as to be generally transverse to the applied magnetic field. Alternatively, the external applied magnetic field can be rotated.

Figure 10A:
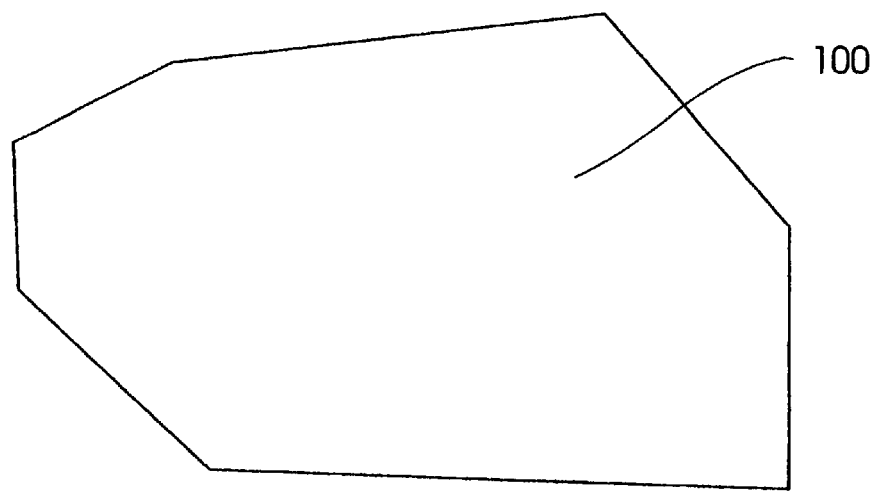
FIGS. 10A–10E illustrate steps in the fabrication of the MTJ MR read head of the present invention according to FIG. 8.
Figure 10B:
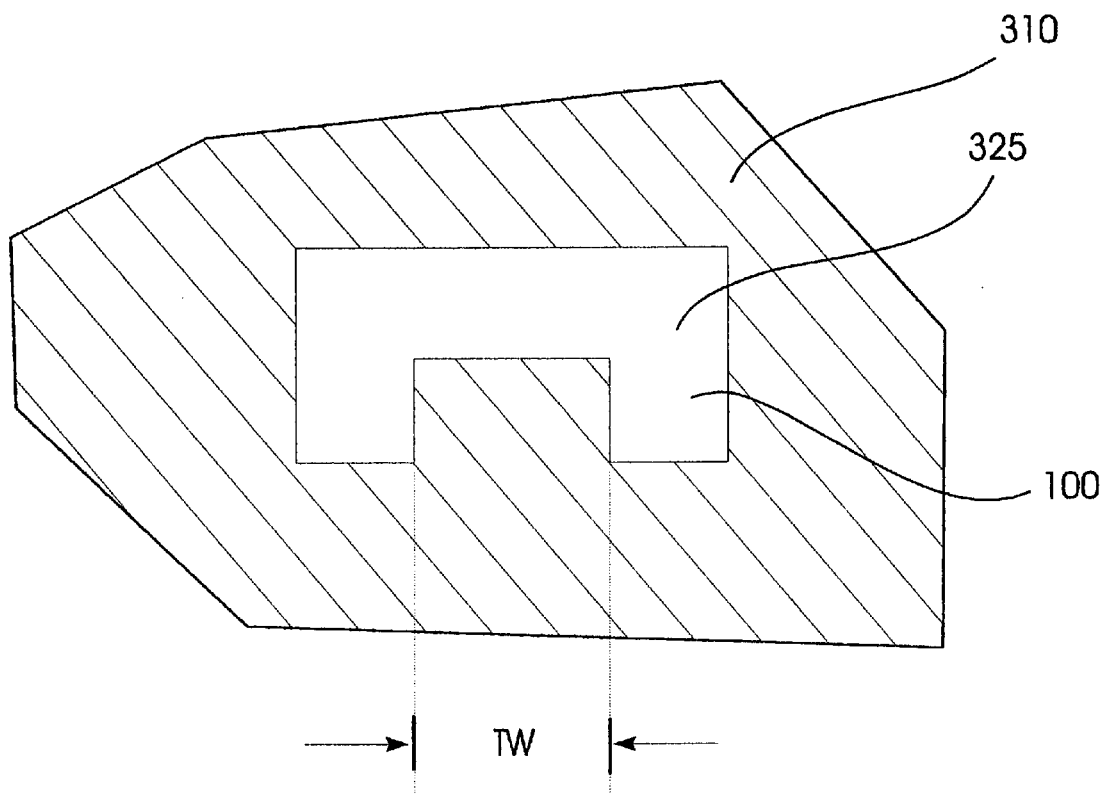

The process starts with the sequential deposition of bottom lead 102 and MTJ 100 (which includes the top capping layer 134). These layers are then patterned into the shape of the bottom electrical lead 102, a part of which is shown by FIG. 10A. In the next step, FIG. 10B, lithography is used to form an open region 325 corresponding to the continuous boundary bias region. This is accomplished by first covering the MTJ 100 with a layer of photoresist 310 which is subsequently exposed and patterned to form the open region 325. This step also defines the effective track width TW of the MTJ 100 as the inside dimension of the opening 325 which is formed. As shown in FIG. 10B, a positive photoresist 310 has been applied to the lead 102 and MTJ 100 and developed to define the track width TW. Subsequently, material in the form of the shape 325 is removed from the MTJ 100 by ion milling down to the electrical lead layer 102. By suitable choice of material for capping layer 134 (FIG. 4), it may also be possible to reactively ion etch the capping layer 134 before ion milling the remaining MTJ layers.

Figure 10C:
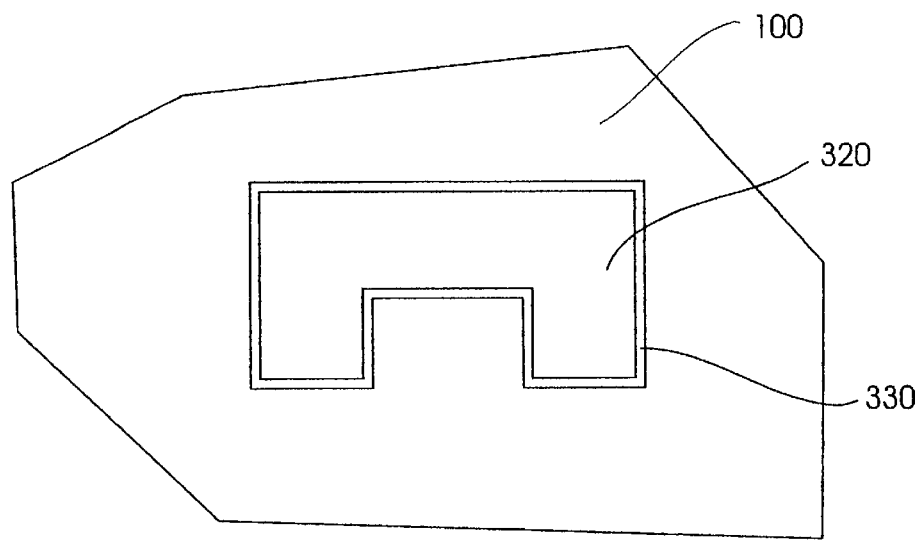

Next, in FIG. 10C, the deposition of the initial alumina insulator layer 330, CoPtCr hard ferromagnetic CBB layer 320, and subsequent alumina insulator layer 330 are deposited through the opening 325 in photoresist 310, leaving a region of electrically isolated biasing material that forms the CBB layer 320.

The insulating layer 330 and the hard ferromagnetic layer 320 are formed using three distinct depositions. First, a first alumina deposition forms the bottom portion of layer 330 and also conforms onto the side walls and back wall of the MTJ 100 or the top part or layers of the MTJ 100 (FIG. 4), depending on the depth to which the region 325 is ion milled. If an RF sputter deposition technique is used for the insulating layer deposition, the thickness of the insulating layer on the side wall is less than on a flat surface. Typical sputter efficiencies on side walls are ½ to ¾ that of the sputter efficiencies on flat surfaces. Second, the hard biasing ferromagnetic layer 320 is deposited using a directional deposition technique, such as ion beam deposition. The alumina from the first insulating layer deposition that conforms to the side and back walls of the MTJ 100 serves to insulate the CBB layer 320 from the MTJ 100. Third, a final insulating layer deposition forms the top region of layer 330 and caps or seals the top surface of the CBB layer 320.

Figure 10D:
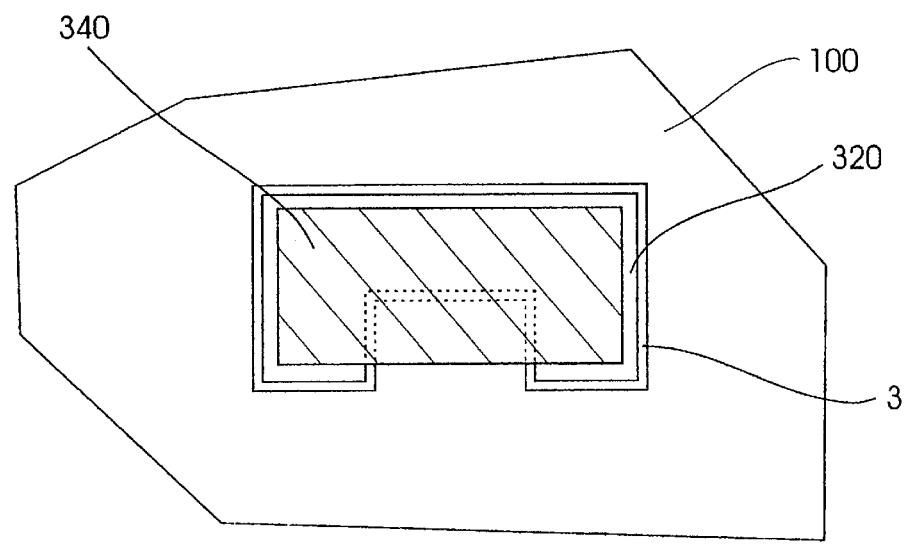
Figure 10E:
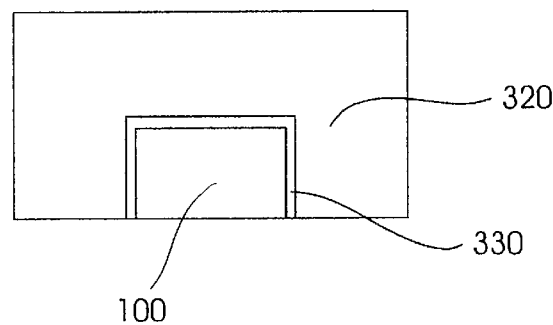

The initial and subsequent alumina layers 330 are preferably formed by RF sputtering to provide full coverage over electrical lead 102 and at the edges of MTJ 100 and are each formed to a thickness of 100–500 Å. This process results in an insulator with high integrity since it is important that the sense current not be shunted through the CBB layer 320. The CBB layer 320, which is preferably a CoPtCr alloy, is preferably formed by a directional deposition process, such as ion beam sputter deposition, so there is no edge overlap, and is deposited to a thickness of approximately twice the thickness of the sensing layer 132. The photoresist 310 and the alumina and hard biasing layers on top of it are then removed in a lift-off process, resulting in an electrically isolated continuous boundary bias region of hard biasing ferromagnetic layer 320 that is located at the left, rear and right side edges of the MTJ 100. FIG. 10C shows the final result of this process and for clarity the insulator isolation edge is shown. Next, lithography is used to form the initial stripe height (before lapping) of the MTJ 100 by deposition and patterning of photoresist 340 (FIG. 10D). Finally, excess tunnel junction material is removed by a process of ion milling down to the electrical conductor 102 to complete the definition of the MTJ read head as illustrated in FIG. 10E. The fabrication of the MTJ MR head structure is then essentially complete, requiring only the final definition of the electrical leads to the device.

With the process flow sequence described in FIGS. 10A–10E the first lithography step (FIG. 10B) defines both the width of the sensor and the back edge of the sensor. However it is difficult to define a narrow back region of sub-micron dimensions using lithography because the exposing light in the lithography process does not allow for adequate removal of resist at the inside corners of the shape 325. In addition, this process sequence provides only a single continuous boundary bias region 320, which means that the strength of the transverse and longitudinal bias fields cannot be independently varied but are coupled to one another. In order to address these two problems the process sequence can modified as shown in FIGS. 11A–11E to form the embodiment of the MTJ MR read head shown in FIG. 9.

Figure 11A:
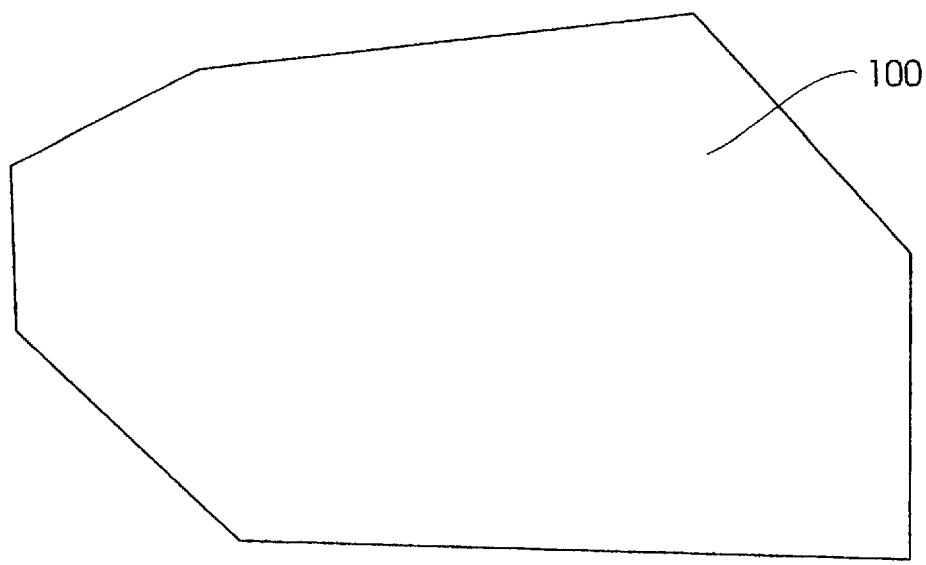
FIGS. 11A–11E illustrate steps in the fabrication of the MTJ MR read head of the present invention according to FIG. 9.
Figure 11B:
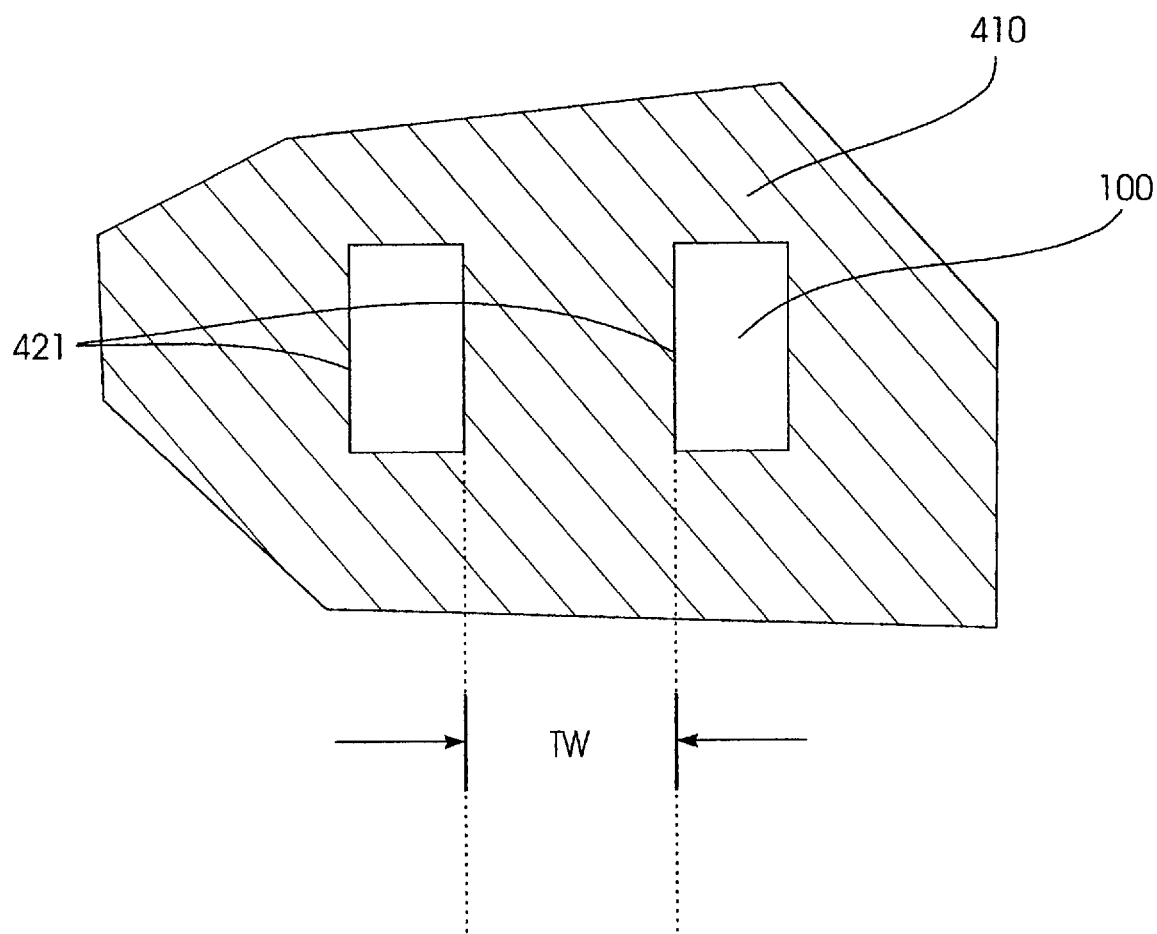

The process flow sequence required for the MTJ read head of FIG. 9 is illustrated in FIGS. 11A–E. This process requires an additional lithography step to define the separate rear edge transverse bias region 425. Again the process starts with the sequential deposition of bottom lead 102 and MTJ 100 (which includes the top capping layer 134). These layers are then patterned into the shape of the bottom electrical lead 102, a part of which is shown by FIG. 11A. In the next step, FIG. 11B, lithography is used to form the two open regions 421 in which will be deposited the longitudinal bias regions at the left and right edges of the MTJ sensor 100. This step also defines the effective track width TW of the MTJ 100. As shown in FIG. 11B, a positive photoresist 410 has been applied to the lead 102 and MTJ 100 and developed to define the track width TW. Subsequently, material in the form of the two shapes 421 is removed from the MTJ 100 by ion milling down to the electrical lead layer 102.

Figure 11C:
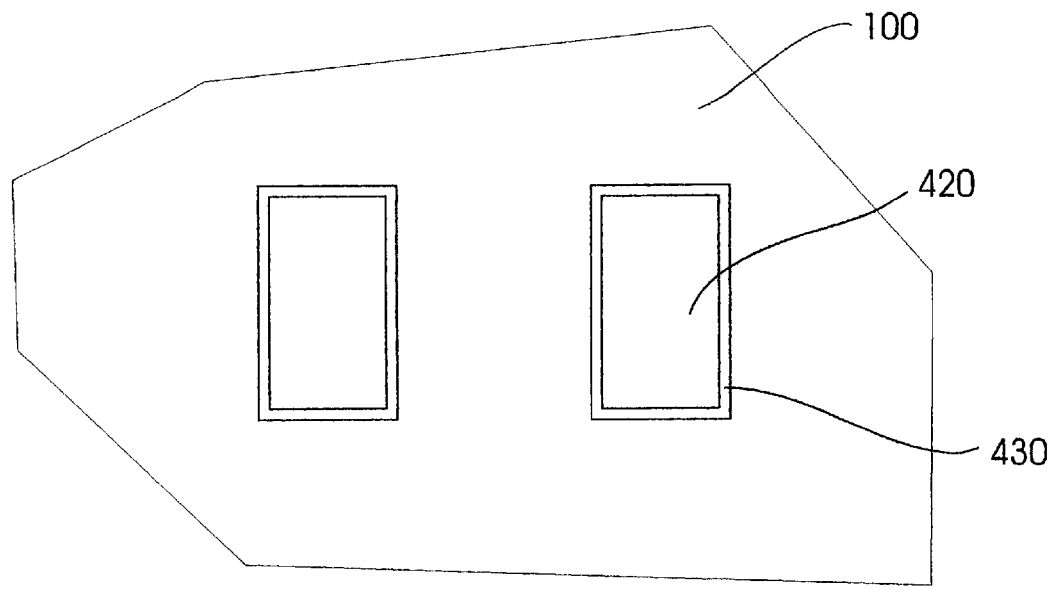
Figure 11D:
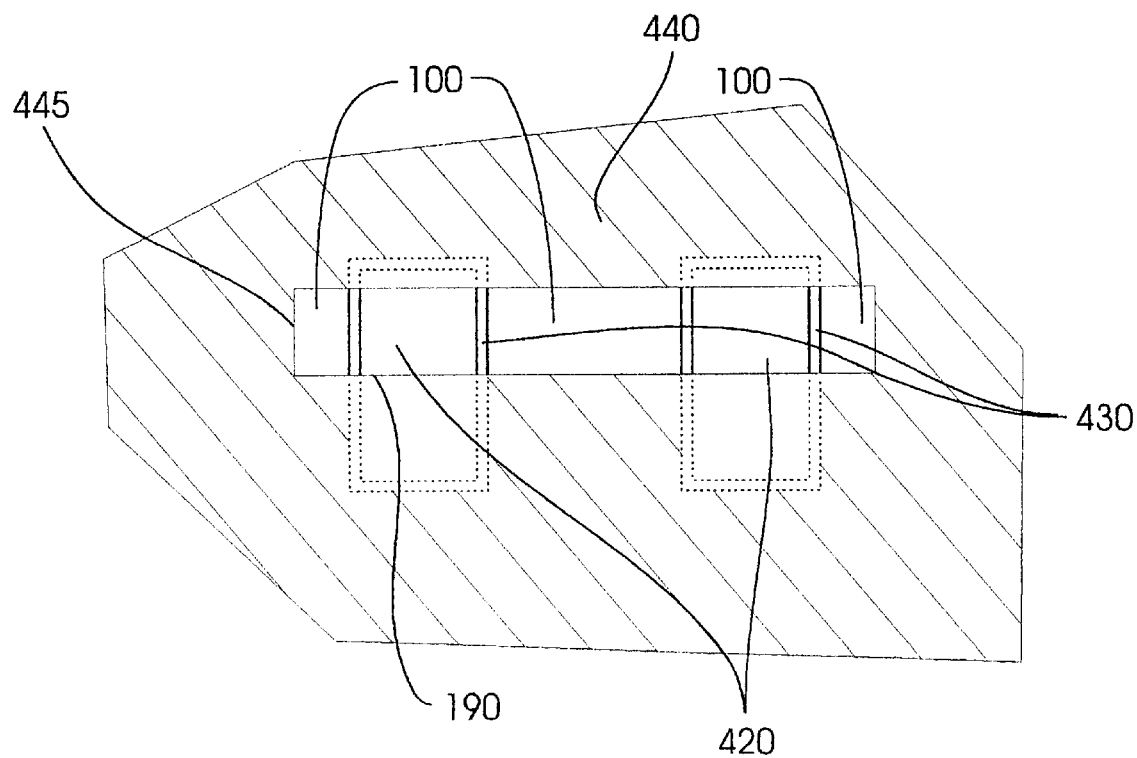
Figure 11E:
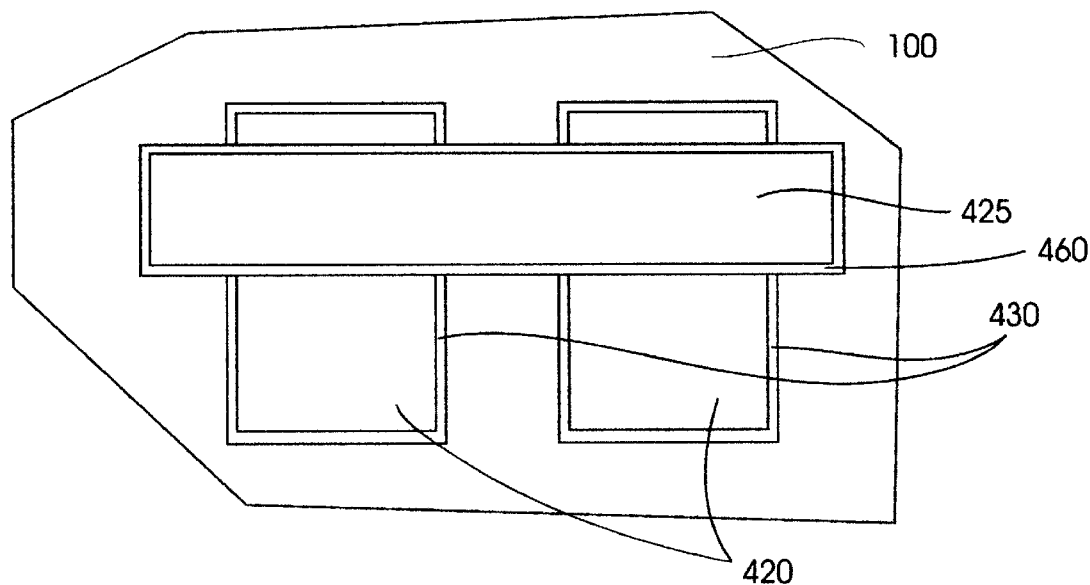
Figure 11F:
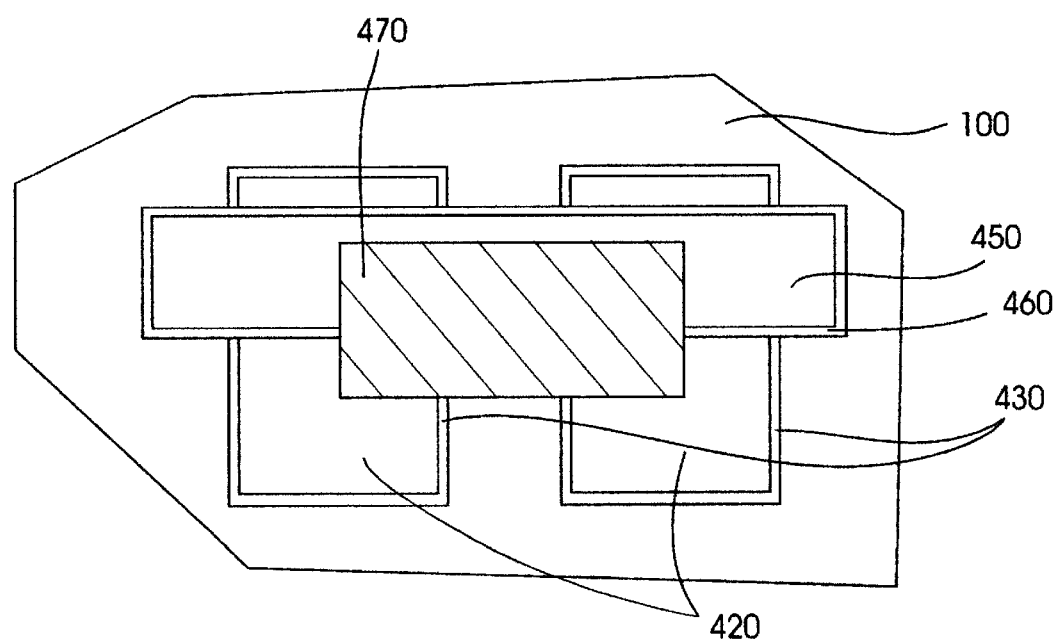
Figure 11G:
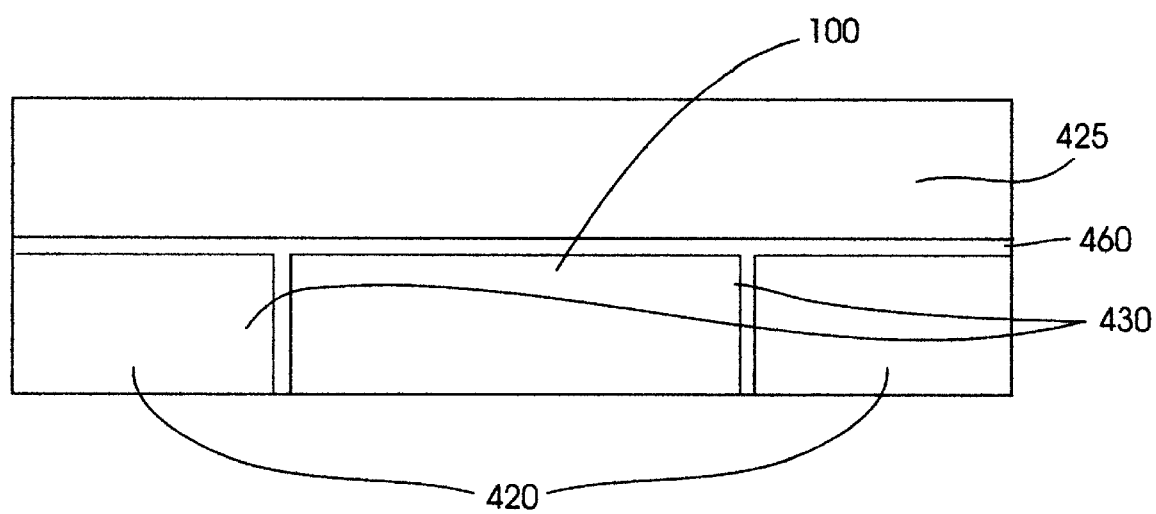

Next, in FIG. 11C, the deposition of the initial alumina insulator layer 430, CoPtCr hard biasing ferromagnetic layer 420, and subsequent alumina insulator layer 430 are deposited through the openings 421 in photoresist 410, leaving a region of electrically isolated biasing material that forms the longitudinal biasing ferromagnetic portions 420. The initial and subsequent alumina layers 430 are preferably formed by RF sputtering to provide full coverage over electrical lead 102 and at the edges of MTJ 100 and are each formed to a thickness of 100–500 Å. This process results in an insulator with high integrity since it is important that the sense current not be shunted through the hard longitudinal biasing regions 420. The hard biasing layer 420, which is preferably a CoPtCr alloy, is preferably formed directionally by a directional deposition process, such as ion beam sputter deposition, so there is no edge overlap, and is deposited to a thickness of approximately twice the thickness of the sensing layer 132. The photoresist 410 and the alumina and hard biasing layers on top of it are then removed in a lift-off process, resulting in electrically isolated longitudinal bias regions 420 that are located at the left and right side edges of the MTJ 100. FIG. 11C shows the final result of this process and for clarity the insulator isolation edge is shown. Next, as shown in FIG. 11D, an additional lithography step using photoresist 440 is used to define an opening 445 in which will be deposited the ferromagnetic material for the rear transverse bias region 425. This lithography step also defines the rear edge of the MTJ sensor 100. A series of steps of ion milling, deposition of alumina insulator 460 and hard ferromagnetic material and lift-off are performed to form the rear region 425 similar to those described above to form the left and right edge hard bias regions 420, leaving the structure as shown in FIG. 11E. Next, lithography is used to form the initial stripe height (before lapping) of the MTJ 100 by deposition and patterning of photoresist 470 (FIG. 11F). Finally excess tunnel junction material is removed by a process of ion milling down to the electrical conductor 102 to complete the definition of the MTJ read head as illustrated in FIG. 11G. The fabrication of the MTJ MR head structure is then essentially complete, requiring only the final definition of the electrical leads to the device.

In order to obtain symmetric output characteristics for the MTJ device, the magnetization direction 133 of the ferromagnetic sensing layer 132 must be maintained in the direction shown in FIG. 4, i.e., along the longitudinal direction with no transverse components. This is accomplished by balancing the various effective transverse magnetic fields to which the ferromagnetic sensing layer is subjected in the absence of any sense field from the recorded medium. Thus a balance is maintained between predominantly the ferromagnetic coupling field $H_F$ between the sensing and fixed ferromagnetic layers, the demagnetization field $H_D$ from the fixed ferromagnetic layer and the transverse bias field arising from either the continuous boundary biasing layer 320 or the transverse biasing layer 420. As previously noted in an MTJ device, since the tunneling current is flowing normal to the layers of the structure, little field is induced from current flow in the films. $H_F$ depends critically on the nature of the interfaces between the ferromagnetic films and the actual junction and the thickness of the junction. $H_F$ can vary from several Oersteds (Oe) to 20–50 Oe. $H_D$ depends on the geometry of the sensor, i.e., final stripe height SH and fixed ferromagnetic layer thickness t, and the fixed ferromagnetic magnetization M, and varies as $[4\pi\times(t/SH)\times M]$. Thus, for t=50 Å, SH=10,000 Å, M=800 emu/cm$^3$, $H_D$ is in the 40 Oe range. $H_d$ and $H_F$ can be varied by varying the geometry of the sensor and the characteristics of the interfaces. For example $H_d$ can be minimized by using the laminated antiparallel fixed layer described in the previously-cited IBM U.S. Pat. No. 5,465,185. The net magnetic moment of such a layer is equivalent to the difference between the two pinned films, this difference being approximately 5 Å, so that $H_D$ is reduced to approximately 4 Oe. $H_F$ can be varied by varying the nature of the interfaces.

After the lead 104 has been patterned and the MTJ MR head structure is essentially complete, it is still necessary to align the magnetization of the fixed ferromagnetic layer 118 in the proper direction. The Fe—Mn layer 116 for exchange coupling with the fixed ferromagnetic layer 118 is antiferromagnetic as deposited. However, its magnetization must be realigned so that it can exchange couple the fixed ferromagnetic layer 118 in the proper orientation. The structure is placed in an annealing oven and the temperature is raised to approximately 180° C., which is greater than the blocking temperature of Fe—Mn. At this temperature, the Fe—Mn layer no longer gives rise to an exchange anisotropy with the fixed ferromagnetic layer 118. An exchange anisotropy of the ferromagnetic layer 118 is developed by cooling the pair of layers 116, 118 in a magnetic field. The orientation of the magnetization of the fixed ferromagnetic layer 118 will be along the direction of the applied magnetic field. The applied magnetic field in the annealing oven thus causes the moment of the fixed ferromagnetic layer 118 to be fixed along the required direction perpendicular to the ABS, as shown by the arrow 119 in FIG. 4. This is a result of cooling the Fe—Mn layer in the presence of the ferromagnetic layer 118, magnetized by the applied magnetic field, in the required direction. Thus, at temperatures below the blocking temperature of Fe—Mn, in the presence of an applied magnetic field from the recorded medium, the magnetization of the fixed ferromagnetic layer 118 will not substantially rotate.

The final stripe height SH of the MTJ 100 in the device is formed by lapping the lithographically-formed front sensing edge to a final dimension back to line 161 (FIG. 6), thereby completing the structures shown in FIGS. 8 and 9.

The biasing ferromagnetic layers 320 and 420, 425 may be formed from a single layer of a high coercivity material such as an alloy of Co and one or more other elements, such as a Co—Pt binary alloy, or a Co—Pt—Cr ternary alloy (e.g. Co$_{75}$Pt$_{12}$Cr$_{13}$) or a Co—Pt—Ni ternary alloy or a Co—Cr—Ta ternary alloy. In addition to using a single layer of high coercivity material, the biasing ferromagnetic layer may be a dual-film structure comprising a first ferromagnetic film and an antiferromagnetic film in contact with and interfacially exchange coupled with the first ferromagnetic film. The antiferromagnetic film secures the magnetic moment of the first ferromagnetic film in the desired direction. The ferromagnetic film may be Ni—Fe and the antiferromagnetic film may be Ni—Mn. In this dual-film embodiment the antiferromagnetic film must be made of a material that has a blocking temperature sufficiently distinct from the blocking temperature of the material used for the antiferromagnetic layer 116. Ni—Mn has a blocking temperature of up to higher than approximately 450° C. and Fe—Mn has a blocking temperature of approximately 200° C. Thus the exchange bias field provided by the antiferromagnetic layer with the higher blocking temperature is set first by heating the device to a temperature above this blocking temperature and cooling in a magnetic field oriented along the direction of whichever ferromagnetic layer (either 150 or 118) is exchange coupled to the antiferromagnetic layer with the higher blocking temperature. Then, in a second step, after cooling to a temperature slightly greater than the blocking temperature of the other antiferromagnetic layer, the magnetic field orientation (or alternatively the device orientation) is rotated by 90 degree and the device is further cooled.

The detailed description of the MTJ device has been presented above with respect to its use as a MR read head. However, the invention is fully applicable to other applications of MR sensors, for example in sensors designed to measure the rotation of a device, e.g., automobile wheels or gears, or to sensors designed to measure linear position.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device for connection to sense circuitry for detecting changes in electrical resistance within the device, the device comprising:

a substrate;

a first electrically conductive lead formed on the substrate;

a magnetic tunnel junction stack formed on the first lead and comprising a fixed ferromagnetic layer having its magnetic moment fixed in the absence of an applied magnetic field, an insulating tunnel barrier layer in contact with the fixed ferromagnetic layer, and a sensing ferromagnetic layer in contact with the insulating tunnel barrier layer, the sensing ferromagnetic layer having a generally rectangular shape with a long back edge and two shorter opposite side edges;

a second electrically conductive lead formed on and in contact with the magnetic tunnel junction stack;

a biasing ferromagnetic layer for biasing the magnetic moment of the sensing ferromagnetic layer in a preferred direction in the absence of an applied magnetic field, the biasing ferromagnetic layer being formed on the substrate around said back and side edges of the sensing ferromagnetic layer and spaced from said back and side edges and having two side portions located near respective side edges of the sensing ferromagnetic layer and a back portion located near said back edge of the sensing ferromagnetic layer, said side portions having a magnetic moment oriented in a different direction from the magnetic moment of said back portion;

an electrically insulating layer separating the two biasing ferromagnetic layer side portions from contact with the biasing ferromagnetic layer back portion and said two side portions and said back portion from contact with the sensing ferromagnetic layer;

whereby when the electrical leads are connected to the sense circuitry the electrical resistance to current flow perpendicularly through the layers in said stack is determined by the relative orientation of the magnetic moments of the fixed and sensing ferromagnetic layers, and sense current is prevented from shunting to said biasing ferromagnetic layer.

2. The device according to claim 1 wherein the back portion of the biasing ferromagnetic layer has a magnetic moment within its plane that is oriented between greater than −90 degrees and less than +90 degrees, where 0 degrees corresponds to a longitudinal direction generally parallel to the back edge of the generally rectangularly shaped sensing ferromagnetic layer and in the direction of the magnetic moment of the sensing layer in the absence of an applied magnetic field.

3. The device according to claim 1 wherein the magnetic moments of the fixed and sensing ferromagnetic layers are oriented generally orthogonal to one another in the absence of an applied magnetic field.

4. The device according to claim 1 wherein the insulating layer also electrically insulates the biasing ferromagnetic layer from at least one of said leads.

5. The device according to claim 1 wherein the first electrical lead is the bottom lead, the magnetic tunnel junction stack is formed on the substrate such that the fixed ferromagnetic layer is in electrical connection with the first electrical lead, and the second electrical lead is the top lead and is in electrical contact with the sensing ferromagnetic layer.

6. The device according to claim 1 wherein the first electrical lead is the bottom lead, the magnetic tunnel junction stack is formed on the substrate such that the sensing ferromagnetic layer is in electrical connection with the first electrical lead, and the second electrical lead is the top lead and is in electrical contact with the fixed ferromagnetic layer.

7. The device according to claim 1 wherein all of the layers in said stack have generally the same rectangular shape with contiguous side edges.

8. The device according to claim 1 wherein the magnetic tunnel junction stack further comprises an antiferromagnetic layer in contact with the fixed ferromagnetic layer for fixing the magnetic moment of the fixed ferromagnetic layer in said preferred direction by interfacial exchange coupling.

9. The device according to claim 1 wherein the biasing ferromagnetic layer is formed of an alloy comprising Co, Pt and Cr.

10. The device according to claim 1 wherein the biasing ferromagnetic layer comprises a ferromagnetic film and an antiferromagnetic film in contact with and interfacially exchange coupled with the ferromagnetic film.

11. The device according to claim 10 wherein the ferromagnetic film comprises an alloy of Ni and Fe, and wherein the antiferromagnetic film comprises an alloy of Ni and Mn.

12. A magnetic tunnel junction magnetoresistive read head for sensing data magnetically recorded on a medium, the head having a sensing surface for facing the medium and comprising:

a substrate;

a fixed ferromagnetic layer formed over the substrate, the magnetization direction of the fixed ferromagnetic layer being fixed along a direction generally perpendicular to the sensing surface so as to be substantially prevented from rotation in the presence of an applied magnetic field from the medium;

an insulating tunneling barrier layer located on and in contact with the fixed ferromagnetic layer;

a sensing ferromagnetic layer located on and in contact with the tunneling barrier layer and whose magnetization is oriented in a preferred direction generally parallel to the sensing surface and generally perpendicular to the magnetization direction of the fixed ferromagnetic layer in the absence of an applied magnetic field and is free to rotate in the presence of an applied magnetic field from the medium, the sensing ferromagnetic layer having a generally rectangular shape with a long sensing edge parallel to the sensing surface, a long back edge parallel to the sensing edge and two shorter opposite side edges;

a biasing ferromagnetic layer formed on the substrate around said back and side edges of the sensing ferromagnetic layer and spaced from said back and side edges for biasing the magnetization direction of the sensing ferromagnetic layer in said preferred direction in the absence of an applied magnetic field, the biasing ferromagnetic layer having two side portions located near respective side edges of the sensing ferromagnetic layer and a back portion located near said back edge of the sensing ferromagnetic layer, said side portions having a magnetic moment oriented in a different direction from the magnetic moment of said back portion;

an electrically insulating layer separating the two biasing ferromagnetic layer side portions from contact with the biasing ferromagnetic layer back portion and said two side portions and said back portion from contact with the sensing ferromagnetic layer; and a pair of electrical leads, each lead being connected to a respective one of the fixed and sensing layers and electrically isolated from the biasing layer by the insulating layer, whereby when a sense current is passed between the leads it passes generally perpendicularly through the insulating tunneling barrier layer without passing into the biasing layer.

13. The head according to claim 12 further comprising an antiferromagnetic layer in contact with the fixed ferromagnetic layer for fixing the magnetization direction of the fixed ferromagnetic layer by interfacial exchange coupling.

14. The head according to claim 12 wherein a first one of the electrical leads is formed on the substrate and wherein the antiferromagnetic layer is formed on the substrate and located between the substrate and the fixed ferromagnetic layer, the fixed ferromagnetic layer being formed on and in contact with the antiferromagnetic layer, whereby the magnetization direction of the fixed ferromagnetic layer is fixed by interfacial exchange coupling with the antiferromagnetic layer.

15. The head according to claim 12 wherein a first one of the electrical leads is formed on the substrate and wherein the sensing layer is located between the first lead and the insulating tunneling barrier layer.

16. The head according to claim 12 wherein the fixed ferromagnetic layer, the tunneling barrier layer, and the sensing ferromagnetic layer are formed as a stack of layers with the fixed ferromagnetic layer and the tunneling barrier layer having edges generally coplanar with the rectangular edges of the sensing ferromagnetic layer, and wherein the insulating layer electrically insulates said stack from the biasing ferromagnetic layer and said electrical leads.

17. The head according to claim 12 wherein the back portion of the biasing ferromagnetic layer has a magnetization direction within its plane that is oriented between greater than −90 degrees and less than +90 degrees, where 0 degrees corresponds to a longitudinal direction generally parallel to the back edge of the generally rectangularly shaped sensing ferromagnetic layer and in the direction of the magnetization of the sensing layer in the absence of an applied magnetic field.

18. The head according to claim 12 wherein the biasing ferromagnetic layer is formed of an alloy comprising Co, Pt and Cr.

19. The head according to claim 12 wherein the biasing ferromagnetic layer comprises a ferromagnetic film and an antiferromagnetic film in contact with and interfacially exchange coupled with the ferromagnetic film.

20. The head according to claim 11 wherein the ferromagnetic film comprises an alloy of Ni and Fe, and wherein the antiferromagnetic film comprises an alloy of Ni and Mn.

* * * * *